United States Patent [19]

Clinton

[11] 4,258,337
[45] Mar. 24, 1981

[54] STABILIZED OUTPUT POWER OSCILLATOR

[75] Inventor: James R. Clinton, Seattle, Wash.

[73] Assignee: Huntron Instruments, Inc., Lynnwood, Wash.

[21] Appl. No.: 73,888

[22] Filed: Sep. 10, 1979

[51] Int. Cl.³ .............................................. H03B 5/26
[52] U.S. Cl. .................................. 331/110; 331/114; 331/142
[58] Field of Search .............. 331/110, 109, 142, 114, 331/108 D, 108 A

[56] References Cited

U.S. PATENT DOCUMENTS 3,851,276  11/1974  Kaplan ............................. 331/110 X
3,980,970  9/1976  Grundy ............................ 331/108 D

FOREIGN PATENT DOCUMENTS 1905969  9/1969  Fed. Rep. of Germany .......... 331/110

Primary Examiner—Siegfried H. Grimm
Assistant Examiner—Edward P. Westin
Attorney, Agent, or Firm—Cole, Jensen & Puntigam

[57] ABSTRACT

The oscillator includes a high gain differential amplifier, the output of which alternately drives two sets of transistors which together provide the oscillator output signal. A first set of transistors operates during one-half cycle of the output while the other set is operating during the other half-cycle. A DC feedback path provides degenerative DC feedback to minimize the DC component of the output signal, while an AC feedback path, which includes a filter network which passes the circuit operating frequency at a 180° phase shift relative to the phase of the output signal, provides regenerative AC feedback to maintain circuit oscillation.

11 Claims, 5 Drawing Figures

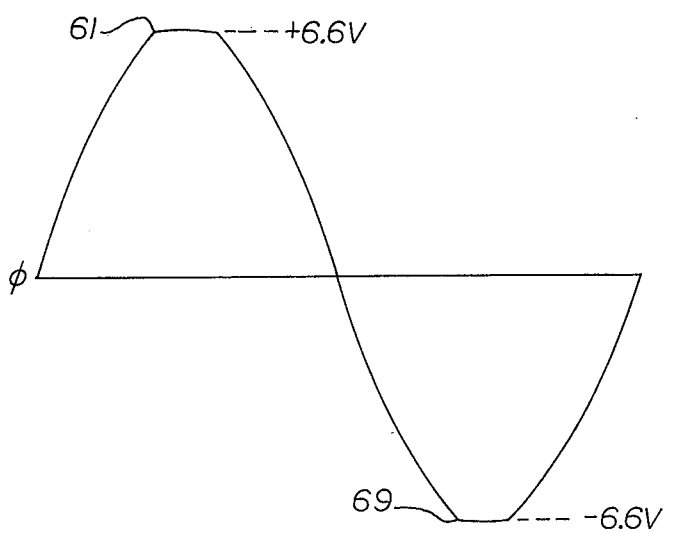
Fig. 2
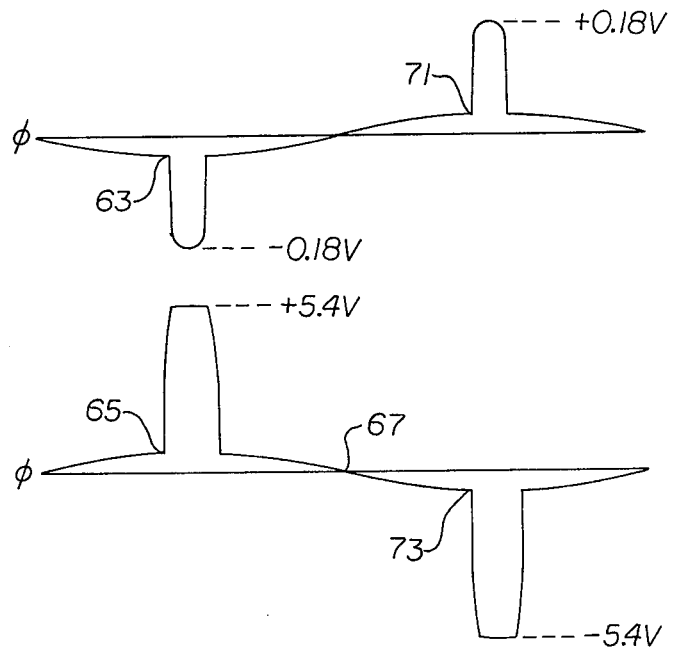
Fig. 3
Fig. 4
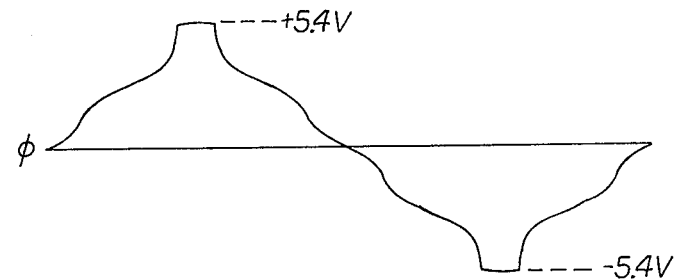
Fig. 5

4,258,337

STABILIZED OUTPUT POWER OSCILLATOR

BACKGROUND OF THE INVENTION

The present invention relates generally to the oscillator art, and more specifically concerns a power oscillator capable of driving a wide range of loads without adversely affecting the output.

Most electrical instruments and similar apparatuses are designed to operate adequately on line voltage. For some, however, the line voltage is not adequate, because the waveform is not sufficiently uniform and contains frequent distortions, although the frequency of the signal is usually sufficiently well-regulated. The non-uniformity of the waveform and the waveform distortions, usually in the forms of small peaks, interfere with the proper functioning of the instrument and in some cases cause erroneous output information.

The electronic test instrument which is the subject of U.S. Pat. No. 4,074,195, issued Feb. 14, 1978, titled "Semi-Conductor Tester," is an example of an instrument which can be adversely affected in operation by distortions in the line signal. Other test instruments and devices have similar operating problems with the line signal. One alternative is a separate, self-contained AC voltage supply, i.e. an oscillator. However, many devices which have difficulty operating with the line signal also must operate over a wide range of loads, and most conventional oscillators are not able to drive into heavy loads without seriously affecting their output, and thus are not typically used in such applications. For the test instrument in U.S. Pat. No. 4,074,195, for instance, the supply must be able to drive a signal transformer with loads on the secondary as heavy as 10 ohms, without the supply output being significantly affected.

Thus, it is a general object of the present invention to provide an oscillator circuit which can effectively operate as a power source for electrical instruments and similar devices.

It is another object of the present invention to provide such an oscillator circuit which is capable of providing a stable output under varying load conditions.

It is an additional object of the present invention to provide such an oscillator circuit which also functions as a high gain power amplifier.

It is a further object of the present invention to provide such an oscillator circuit which has an output with a very low DC component.

It is a still further object of the present invention to provide such an oscillator circuit which has a low output impedance.

It is yet another object of the present invention to provide such an oscillator circuit which is capable of self-correcting its output under varying load conditions.

SUMMARY OF THE INVENTION

Accordingly, the present invention includes a differential amplifier means, first and second signal amplifying means, and AC and DC feedback means. The differential amplifier means is responsive to an input signal for producing an amplified output signal. The first signal amplifying means is responsive to the amplified output signal for providing the positive half-cycle of the oscillator output signal, while the second signal amplifying means is responsive to the amplified output signal for providing the negative half-cycle of the oscillator output signal. The AC feedback means is connected between the output of the oscillator and the inverting input of the differential amplifier means for regenerative feedback of the AC portion of the oscillator output signal, while the DC feedback means is connected between the output of the oscillator and the inverting input of the differential amplifier means for degenerative feedback of the DC portion of the oscillator output signal.

DESCRIPTION OF THE DRAWINGS

A more thorough understanding of the invention may be obtained by a study of the following detailed description taken in connection with the accompanying drawings in which:

FIG. 2 is a signal diagram showing the output of the oscillator circuit of FIG. 1.

FIG. 3 is a signal diagram showing the signal from the AC feedback path present at the inverting input of the differential amplifier portion of the oscillator circuit of FIG. 1.

FIG. 4 is a signal diagram showing the output of the differential amplifier portion of the oscillator circuit of FIG. 1 for normal loads.

FIG. 5 is a signal diagram showing the output of the amplifier portion of the oscillator circuit of FIG. 1 for a load of 10 ohms on the secondary of the signal transformer.

DESCRIPTION OF THE PREFERRED EMBODIMENT

Figure 1:
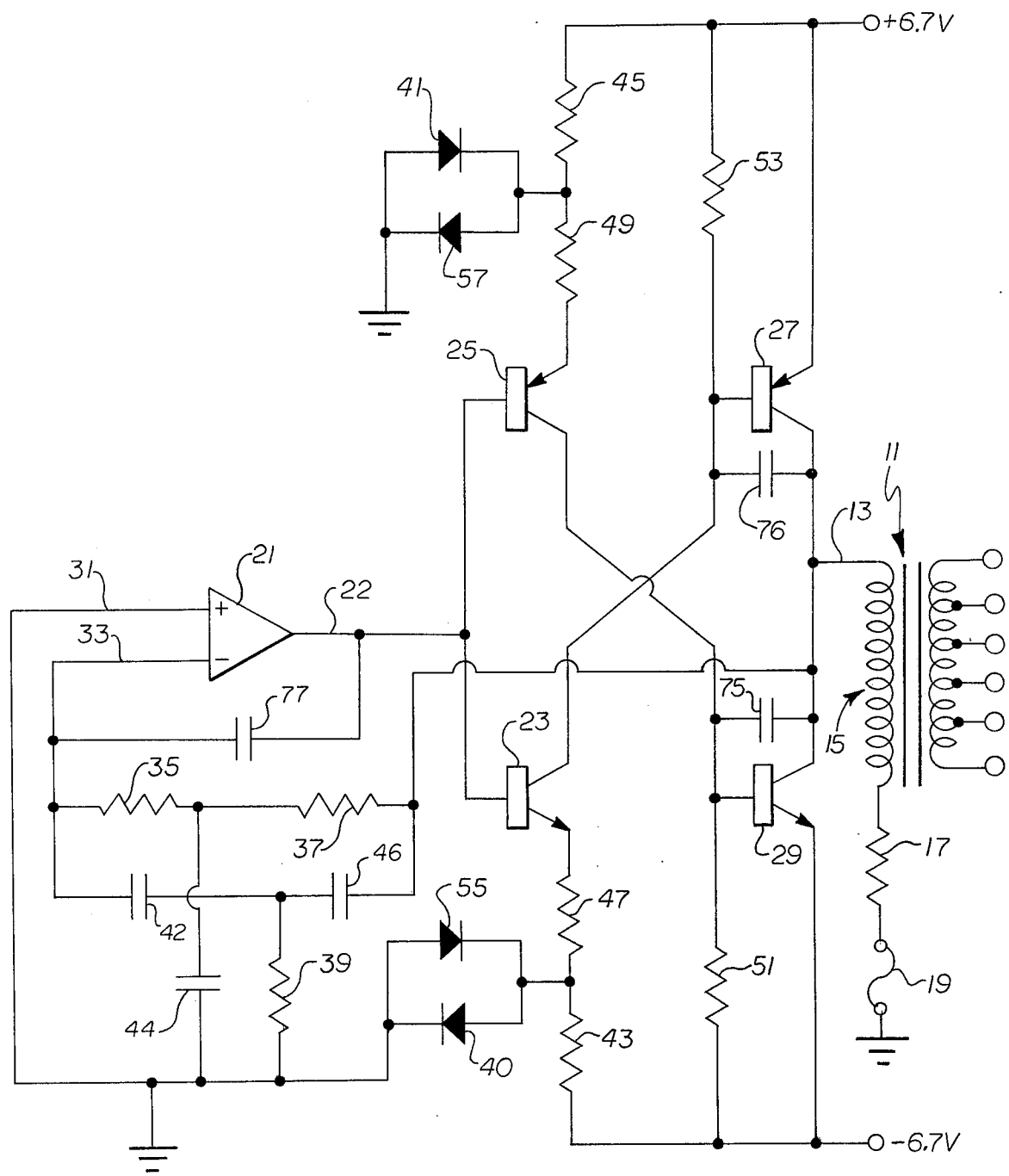
FIG. 1 is a schematic diagram of the oscillator circuit of the present invention, shown driving a signal transformer.

Referring to FIG. 1, the oscillator circuit of the present invention is shown driving a signal transformer referred to generally at 11, which, for instance, may be similar to the signal transformer shown in U.S. Pat. No. 4,095,195. The output of the oscillator circuit is balanced, with ±6.7 volt DC voltage supplies. The output line 13 of the oscillator circuit is connected to the upper end of the primary winding 15 of transformer 11. The primary winding 15 is referenced to ground through resistor 17, which in the embodiment shown is 10 ohms, and a fuse 19.

The oscillator circuit includes a high gain differential amplifier 21 which alternately drives two sets of output transistors into signal transformer 11 through output line 13. The line 22 on which the output of differential amplifier 21 appears is connected to the bases of transistors 23 and 25. The collector of transistor 23 is connected to the base of transistor 27, thereby forming a first set of transistors, while the collector of transistor 25 is connected to the base of transistor 29, thereby forming a second set of transistors.

The respective collectors of transistors 27 and 29 are connected to output line 13, on which appears the output of the oscillator circuit. The first set of transistors provides the positive half-cycle of the oscillator output signal, while the second set of transistors provides the negative half-cycle of the oscillator output signal.

The differential amplifier 21 has two inputs 31 and 33. Input 31 is non-inverting and is referenced to ground, while input 33, which is inverting, receives both regenerative and degenerative feedback from the output of the oscillator circuit. A DC feedback loop, comprising resistors 35 and 37, provides the degenerative feedback, to minimize the DC component of the oscillator output signal, while an AC feedback loop, comprising resistors 35, 37 and 39 and capacitors 42, 44 and 46 provides the regenerative feedback to maintain circuit oscillation. The loop gain of the oscillator circuit is slightly greater than one, to maintain oscillation, without distortion.

The oscillator output signal on line 13 is shown in FIG. 2. It has a uniform, symmetrical waveform, with clipped peaks, but otherwise is substantially distortionless, and has a ±peak voltage of 6.6 volts. The oscillator circuit has a very low output impedance, approximately 0.7 ohms, and is capable of driving heavy loads without significant change in its output, due to self-correcting feedback circuit operation explained hereinafter.

In the embodiment shown, amplifier 21 is a 741 operational amplifier having a nominal gain of 100,000. A relatively high gain amplifier, such as the 741, is important to the operation of the oscillator circuit, but other amplifiers besides a 741 can be used successfully.

When the operation of the apparatus of FIG. 1 is initiated, transistors 23, 25, 27 and 29 will all, for an instant, be lightly on. Diodes 55 and 57 will be forward biased through the respective ±6.7 volt supplies and resistors 43 and 45, respectively, which in the embodiment shown are 2.2 Kohms. Approximately −0.620 volts is present at the cathode of diode 55 and +0.620 volts at the plate of diode 55. These voltages, respectively, are in turn developed across the base-to-emitter circuits of transistors 23 and 25, slightly forwarding biasing those junctions, so that emitter current flow in those transistors occurs. Resistors 47 and 49, which in the embodiment shown are 270 ohms, limit the emitter current of transistors 23 and 25 to approximately 224 microamps.

This initial emitter current, minus base drive current of a few microamps, of transistors 23 and 25 flows through the respective collectors of those transistors and then through, respectively, resistors 53 and 51, which in the embodiment shown are 3.3 Kohms. The voltage across resistors 51 and 53 is greater than 0.680 volts, which slightly forward biases transistors 27 and 29, lightly turning them on. All of this action occurs at the instant of turn-on, and hence, all four transistors 23, 25, 27 and 29 are slightly forward biased and thus lightly on immediately after turn-on of the apparatus.

Immediately after this initial condition, however, collector current begins to flow in both of the output transistors 27 and 29, due to the ±6.7 volt supplies. One of the transistors 27, 29 will immediately begin to dominate the other at the output, as the current amplification characteristics of the two transistors will be slightly different. Depending upon which transistor initially is dominant, the output signal on output line 13 will begin to go either positive or negative. This output signal, which is beginning to go in one direction or the other, is fed back through the AC regenerative feedback loop, amplified in amplifier 21, and then applied on line 22 to transistors 23 and 25. The set of transistors containing the dominant output transistor will turn on more, and the other set will become quiescent, causing output to swing in the direction of the initially dominant output transistor; circuit oscillation thus begins.

The DC feedback path is from the output of the oscillator circuit, i.e. output line 13, back to the inverting input 33 of differential amplifier 21, through the series connection of resistances 35 and 37. In the embodiment shown, both of these resistors are 20 Kohms. The DC feedback maintains the DC component of the oscillator output signal very near ground potential, at a level of a few millivolts. The DC signal feedback is degenerative, because, with the signal inversions in the loop, the feedback signal from the output transistor is out of phase with the DC portion of the oscillator output signal on output line 13.

It is important that the DC component of the oscillator output signal remain as low as possible, so that the AC portion of the output signal can use as much as possible of the linear portion of the operating curve of the transformer. As the DC level increases, the center of the output signal moves correspondingly up the transformer operating curve, which results in less room on the linear portion for the positive half-cycle of the output. The AC component of the output signal must therefore be reduced in order to avoid saturation of the transformer and operation on the non-linear portion of the transformer's operating curve.

In the embodiment shown, operating with a signal transformer having a silicon alloy core such as that disclosed in U.S. Pat. No. 4,074,195, the output of the oscillator circuit is established so that the peak of the output signal will result in a flux density of approximately 7,000 gauss, which is considerably below the saturation level of approximately 9,200 gauss.

The AC feedback path includes resistors 35 and 37 but also resistance 39 and capacitors 42, 44 and 46. In the embodiment shown, resistance 39 is 10 Kohms, capacitors 41 and 45 are 0.1 microfarads, and capacitor 43 is 0.2 microfarads. The components are arranged in a bridge T, formed of a combination of a low pass filter, which comprises resistors 35 and 37 and capacitor 43, and a high pass filter, which comprises capacitors 42 and 46 and resistor 39. Such a network is known as a notch filter, as it passes only a very few or perhaps only one frequency at exactly a 180° phase shift from input to output.

The network shown in FIG. 1, with the circuit values mentioned above, are designed to pass a frequency of 80 Hertz, which is the selected operating frequency of the oscillator. The 80 Hertz signal feedback to the inverting input 33 of the differential amplifier 21 through the notch filter network is exactly 180° out of phase with the output signal. Differential amplifier 21 amplifies the signal at the inverting input and inverts it. The transistors in the transistor set will cause another 360° of phase shift, and hence, the signal from the output transistor will be in phase with the oscillator output signal and will tend to reinforce the direction of the output signal.

As explained above, following the instant that the circuit is turned on, the oscillator output signal will begin to increase in amplitude in the positive half-cycle or the negative half-cycle, depending upon whether transistor 27 or 29 has the dominant Beta characteristic. Assuming that the output begins to go positive, which for the embodiment shown means that transistors 23 and 27 are on, and transistors 25 and 29 are essentially off, the AC regenerative feedback through the feedback network will continue to force the oscillator signal output on line 13 more positive, until transistor 27 saturates, at which point the output of the oscillator stops changing, which is shown as point 61 in the waveform of FIG. 2. This point in time corresponds to point 63 in the waveform of FIG. 3, which is the AC feedback signal at the inverting input of differential amplifier 21. The waveform of FIG. 3 is somewhat exaggerated, as the low level portion of the signal is approximately 15 microvolts while the signal peaks are ±0.180 volts. Further, the positive and negative portions of the waveform will vary slightly from each other unless the output transistors are matched.

At the instant that the oscillator output signal stops changing, capacitors 42 and 46 begin to discharge very rapidly into the inverting input 33 of amplifier 21. The result of this discharge is shown by the very steep negative rise in the negative half-cycle of the waveform of FIG. 3. The output of the differential amplifier 21, which is shown in FIG. 4, follows the signal at the inverting input, with point 65 in that waveform being comparable to points 63 and 61 of FIGS. 3 and 2, respectively. Thus, the sharp negative rise at the inverting input, caused by the rapid discharge of the capacitors in the AC feedback network, results in a rapid positive rise in the voltage at the output of the differential amplifier.

In the embodiment shown, the voltage at the inverting input 33 goes rapidly negative to approximately −0.18 volts, and correspondingly, the voltage at the output of the differential amplifier will rise to approximately +5.4 volts, at which point amplifier 21 becomes saturated, as shown by the clipped peaks of the waveform of FIG. 4.

The discharge of the capacitors is completed rapidly and the voltage at the noninverting input 33 begins to go less negative, toward zero, as shown in FIG. 3. The circuit now begins to reverse itself and it swings into the other half-cycle. The output of the differential amplifier 21 follows, going less positive, until it reaches zero and then begins to go negative. The signal reversal takes place quickly, as the pulse width of the spike portions of the signal of FIG. 4 is approximately 1.6 milliseconds, with the pulse width of the corresponding portions of the signal of FIG. 3 somewhat less. Transistors 23 and 27 turn off and transistors 25 and 29 turn on and the regenerative AC feedback forces the circuit to a maximum in the other half-cycle. The loop gain of slightly greater than one is sufficient to maintain oscillation, but is not so great as to overdrive the notch filter and resulting in distortion.

The oscillator output signal (FIG. 2) increases in amplitude until the output transistor for that half-cycle saturates. The signal at line 13 thus continues to go more negative, following the output of amplifier 21, until transistor 29 saturates, shown as point 69 in FIG. 2. This corresponds with points 71 and 73 in the waveforms of FIGS. 3 and 4, respectively. At its negative peak, the output of the oscillator circuit is at a negative 6.6 volts, while the output from amplifier 21 and the signal at the inverting input of the amplifier 21 are still quite low.

At this point, capacitors 41 and 45 are again charged, and when the output of the circuit stops changing, the capacitors discharge into the inverting input of the amplifier 21, with a corresponding rapid rise in the magnitude of the signal at the inverting input toward +0.18 volts, resulting in an amplifier output towards −5.4 volts. As the capacitors become discharged, the voltage at the inverting input of amplifier 21 rapidly decreases, and the output of amplifier 21 follows, going rapidly back toward zero. The circuit thus reverses itself again and the cycle begins to repeat itself, with transistors 23 and then 27 turning on, and transistors 25 and 29 turning off.

The components have values selected so that the circuit oscillates at a particular frequency. In the embodiment shown, the selected frequency is 80 Hertz, which is particularly advantageous for use with the test instrument of U.S. Pat. No. 4,074,195. The selected frequency is sufficiently high that the test instrument is capable of testing capacitors, while not so high that it is swamped by large capacitors in the circuit being tested. It should be understood, however, that the invention described is not limited to a particular frequency but that, in fact, the principles of the present invention are applicable to oscillator circuits having a wide range of selected frequencies.

The output signal of the circuit of FIG. 1 is smooth and uniform. The peaks of the output signal are clipped, but the portion of the waveform between the peaks is without distortion. This portion of the waveform is important for the U.S. Pat. No. 4,074,195 test circuit, and the clipped peaks do not adversely affect the circuit operation. As mentioned above, the output signal waveform for the embodiment shown has a peak voltage of ±6.6 volts, and a frequency of 80 hertz. These values may, of course, be altered by changing the circuit component values.

FIG. 5 shows the output of amplifier 21 when the oscillator circuit is working into a signal transformer having a secondary loaded down by 10 ohms. Additional drive current for transistors 27 and 29 is necessary for such a load. This additional drive current is supplied through diodes 40 and 41. The circuit thus has the capacity to correct its operation to meet heavy loads and maintain output stability. When the 10 ohm load is placed on the transformer, the oscillator output signal on line 13 will initially begin to decrease in amplitude under the influence of the load. This results in the decrease of the amount of degenerative feedback, which consequently results in the regenerative feedback signal being amplified to a greater extent in amplifier 21. Thus, as the load on the oscillator increases, more of the loop gain capability of the amplifier, which is determined by resistors 35 and 37, is used to amplify the AC regenerative signal. This in turn results in an increase in the output voltage; hence, the output is quickly stabilized to its original value by the self-corrective action of the circuit itself. In operation, the circuit shown has resulted in a non-load to full-load voltage variance of less than 5%.

The remaining components in the circuit of FIG. 1, i.e. capacitors 75, 76 and 77, bypass the two output transistors 27 and 29 and amplifier 21. The capacitors form an AC degenerative feedback path for its associated transistor/amplifier at high frequencies, to prevent the possibility of oscillation of those components at high frequencies.

Thus, an oscillator circuit has been described which has the capability of providing power into a wide range of loads and has self-regulating features which provide circuit drive and gain compensation so that the output signal remains substantially stable under various loads. The output signal from the circuit is uniform, symmetrical, and is substantially distortion free.

Although a preferred embodiment of the invention has been disclosed herein for purposes of illustration, it should be understood that various changes, modifications and substitutions may be incorporated in such embodiment without departing from the spirit of the invention as defined by the claims which follow.

What is claimed is:
1. A power oscillator, comprising:
   differential amplifier means responsive to an input signal for producing an amplified output signal;
   first signal amplifying means responsive to the amplified output signal for providing the positive half-cycle of the oscillator output signal;

second signal amplifying means responsive to the amplified output signal for providing the negative half-cycle of the oscillator output signal;

AC feedback means connected between the output of the oscillator and the inverting input of said differential amplifier means for regenerative feedback of the AC portion of the oscillator output signal; and DC feedback means connected between the output of the oscillator and the inverting input of said differential amplifier means for degenerative feedback of the DC portion of the oscillator output signal.

2. An apparatus of claim 1, wherein said first and second signal amplifying means and said differential amplifier means are so arranged that the output impedance of the oscillator is very low, which assists in the oscillator being able to provide a stable output voltage for a variety of loads.

3. An apparatus of claim 1, wherein said AC feedback means is a notch filter comprising a combination of a high pass filter and a low pass filter, arranged to pass substantially only the operating frequency of the oscillator at 180° out-of-phase from the oscillator output signal.

4. An apparatus of claim 1, wherein said DC feedback means includes a resistance means, connected in series between the output of the oscillator and the inverting input of said differential amplifier means.

5. An apparatus of claim 3 or 4, wherein said differential amplifier means has a relatively high gain, and wherein the loop gain of the oscillator is very high.

6. An apparatus of claim 1, wherein said first and second signal amplifying means each include a series connection of first and second transistors.

7. An apparatus of claim 6, including biasing means connected to said first and second signal amplifying means for biasing the first and second transistors thereof slightly on when the operation of the oscillator is initiated.

8. An apparatus of claim 7, wherein the oscillator includes a balanced voltage supply having first and second sides relative to the oscillator output, wherein (1) the output of the differential amplifier means is connected to the base of the first transistors in each said signal amplifying means, (2) the emitters of the first transistors are connected, respectively, through first resistance means to the respective first and second sides of the voltage supply, (3) first diodes are connected between each of said first resistance means and ground, said first diodes providing a small base-to-emitter voltage of the first transistors when the operation of the oscillator is initiated, and (4) the collectors of the first transistors are connected, respectively, to the base of their associated second transistors in the respective signal amplifying means and through second resistance means to the opposite side of the voltage supply from which their emitters are connected.

9. An apparatus of claim 7, wherein each of said first resistance means comprises first and second resistance sections, and wherein said first diodes are connected between said first and second resistance sections and ground, and wherein said biasing means further includes second diodes, connected in parallel with said first diodes, opposite in orientation from said first diodes, said second diodes providing base drive current for the second transistors for heavy loads.

10. An apparatus of claim 9, including high frequency degenerative feedback means connected between the output of the differential amplifier and the inverting input thereof to prevent high frequency parasitic oscillation.

11. An apparatus of claim 10, including high frequency degenerative feedback means connected between the output and the input of the second transistor in each signal amplifying means.

* * * * *